United States Patent
Basker et al.

(10) Patent No.: US 9,570,571 B1
(45) Date of Patent: Feb. 14, 2017

(54) GATE STACK INTEGRATED METAL RESISTORS

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/944,436

(22) Filed: Nov. 18, 2015

(51) Int. Cl.
| | |
|---|---|
| *H01L 29/43* | (2006.01) |
| *H01L 27/06* | (2006.01) |
| *H01L 27/07* | (2006.01) |
| *H01L 49/02* | (2006.01) |
| *H01L 29/66* | (2006.01) |
| *H01L 29/423* | (2006.01) |

(52) U.S. Cl.
CPC ......... *H01L 29/435* (2013.01); *H01L 27/0629* (2013.01); *H01L 27/0738* (2013.01); *H01L 28/24* (2013.01); *H01L 29/4238* (2013.01); *H01L 29/66545* (2013.01)

(58) Field of Classification Search
CPC .............. H01L 29/435; H01L 29/66545; H01L 29/4238; H01L 27/0629; H01L 28/20; H01L 27/0288; H01L 27/0635; H01L 27/0802; H01L 27/0727; H01L 27/0738; H01L 28/24; H01L 29/495; H01L 29/4968; H01L 29/4966; H01L 29/66606; H01L 29/66871
See application file for complete search history.

(56) References Cited

U.S. PATENT DOCUMENTS

| | | | |
|---|---|---|---|
| 4,460,413 A * | 7/1984 | Hirata | ................. H01L 21/033 148/DIG. 111 |
| 7,397,087 B2 | 7/2008 | Chinthakindi et al. | |
| 7,879,666 B2 | 2/2011 | Zhang et al. | |
| 7,994,576 B2 | 8/2011 | Tseng et al. | |
| 8,058,125 B1 | 11/2011 | Lin et al. | |

(Continued)

OTHER PUBLICATIONS

List of IBM Related Patents or Patent Applications Treated as Related; (Appendix P), filed Jun. 16, 2016, 2 pages.

(Continued)

*Primary Examiner* — Mary Wilczewski
*Assistant Examiner* — Erik T Peterson
(74) *Attorney, Agent, or Firm* — Cantor Colburn LLP; Vazken Alexanian

(57) ABSTRACT

Described herein are semiconductor devices and methods of forming the same. In some aspects, methods of forming a semiconductor device includes forming a gate stack having a self-aligning cap and a gate metal on a substrate, depositing a resist mask onto the semiconductor device, and patterning the resist mask such that the gate stack is exposed. Additionally, methods include removing the self-aligning cap and the gate metal from the exposed gate stack, depositing a resistor metal on the semiconductor device such that a metal resistor is formed within the exposed gate stack, and forming a bar contact and contact via above the metal resistor.

18 Claims, 8 Drawing Sheets

(56) References Cited

U.S. PATENT DOCUMENTS

| | | | |
|---|---|---|---|
| 8,492,286 B2 | 7/2013 | Utomo et al. | |
| 8,680,618 B2 | 3/2014 | Eshun | |
| 8,864,342 B2 | 10/2014 | Lim et al. | |
| 9,000,564 B2 | 4/2015 | Montanini et al. | |
| 9,012,293 B2 | 4/2015 | Xiao et al. | |
| 2008/0067629 A1 | 3/2008 | Miyashita | |
| 2013/0314165 A1* | 11/2013 | Tsutsumi | H01L 27/0629 331/34 |
| 2014/0084381 A1 | 3/2014 | Yeh et al. | |
| 2014/0167181 A1* | 6/2014 | Xiong | H01L 27/0629 257/379 |

OTHER PUBLICATIONS

U.S. Appl. No. 15/158,682, filed May 19, 2016, Entitled: Gate Stack Integrated Metal Resistors.

\* cited by examiner

GATE STACK INTEGRATED METAL RESISTORS

BACKGROUND

The present invention relates to metal-oxide-semiconductor field-effect transistors (MOSFET), and more specifically, to forming metal resistors.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and is built with n-doped source and drain junctions. The PFET uses holes as the current carriers and is built with p-doped source and drain junctions.

The fin-type field effect transistor (FinFET) is a type of MOSFET. The FinFET contains a conformal gate around the fin that mitigates the effects of short channels and reduces drain-induced barrier lowering. The "fin" refers to the narrow channel between source and drain regions. Often, a thin insulating high-k gate oxide layer around the fin separates the fin channel from the gate metal.

The evolution of modern complementary metal-oxide semiconductor (CMOS) technology continuously scales down not only the device channel length but also the contact length and resistor scale. As such, typical processes for forming metal resistors suffer from scaling problems at reduced scale. For example, conventional methods of forming metal resistors (RM) typically include forming planar metal resistors patterned using middle of line (MOL) processes. These MOL processes suffer at reduced scale at least because MOL processes can result in metal transistors having topography that causes complexity for subsequent patterning and etching processes.

SUMMARY

In some aspects, methods of forming a semiconductor device includes forming a gate stack having a self-aligning cap and a gate metal on a substrate, depositing a resist mask onto the semiconductor device, and patterning the resist mask such that the gate stack is exposed. Additionally, methods include removing the self-aligning cap and the gate metal from the exposed gate stack, depositing a resistor metal on the semiconductor device such that a metal resistor is formed within the exposed gate stack, and forming a bar contact and contact via above the metal resistor.

In other aspects, methods of forming a semiconductor device include forming a gate stack in a dummy gate region of the semiconductor device, the gate stack having a self-aligning cap and a gate metal and being disposed above a shallow-trench-isolation oxide layer disposed on a substrate. Methods, in some aspects, further include forming a gate stack in a non-dummy gate region of the semiconductor device, the gate stack having a self-aligning cap and a gate metal and being disposed above the substrate. Further, in some aspects methods include, depositing a resist mask onto the semiconductor device, patterning the resist mask such that the gate stack in the dummy gate region is exposed, and removing the self-aligning cap and the gate metal from the exposed gate stack. Additionally, in some aspects methods include depositing a resistor metal on the semiconductor device such that a metal resistor is formed within the exposed gate stack, and forming a bar contact and contact via above the metal resistor.

Also described herein are semiconductor devices that include, in some aspects, a gate stack in a dummy gate region of the semiconductor device, the gate stack having a self-aligning cap and a gate metal and being disposed above a shallow-trench-isolation oxide layer disposed on a substrate. The devices can also include a gate stack in a non-dummy gate region of the semiconductor device, the gate stack having a self-aligning cap and a gate metal and being disposed above the substrate, wherein the gate stack in the dummy gate region is replaced with a metal resistor.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
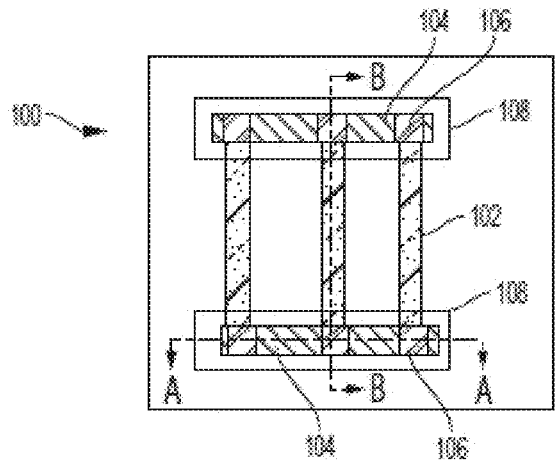
FIG. 1 illustrates a semiconductor device shown from a top-down perspective.

As stated above, the present invention relates to MOSFETs, and particularly to forming metal resistors, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but includes other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As mentioned above, typical processes for forming metal resistors suffer from scaling problems at reduced scale. For example, conventional methods of forming metal resistors (RM) typically include forming planar metal resistors patterned using middle of line (MOL) processes. These MOL processes suffer at reduced scale at least because MOL processes can result in metal transistors having topography that causes complexity for subsequent patterning and etching processes. As such, processes described herein remedy these scaling issues related to forming metal resistors (RM).

As will be described in more detail below, metal resistor can be integrated into a gate stack structure. As such, RM formation within the gate stack provides scaling benefit and can solve patterning problems that are typically associated with MOL resistor forming techniques.

Figure 2:
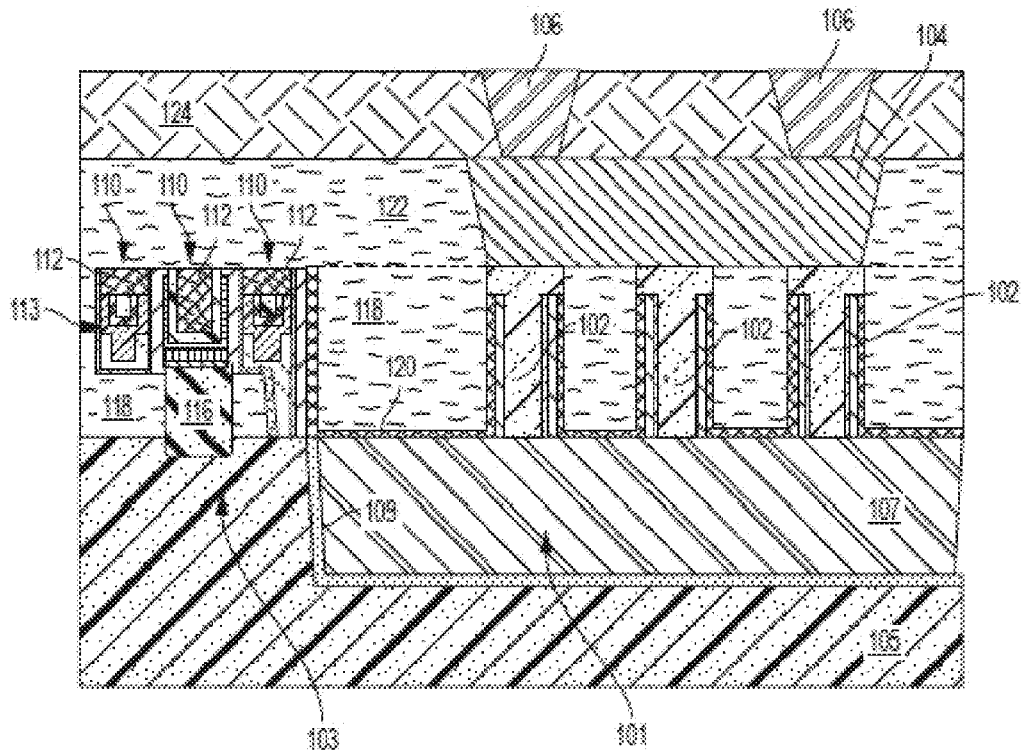
FIG. 2 illustrates a cross-sectional view of the semiconductor device of FIG. 1 cut along line A-A.
Figure 3:
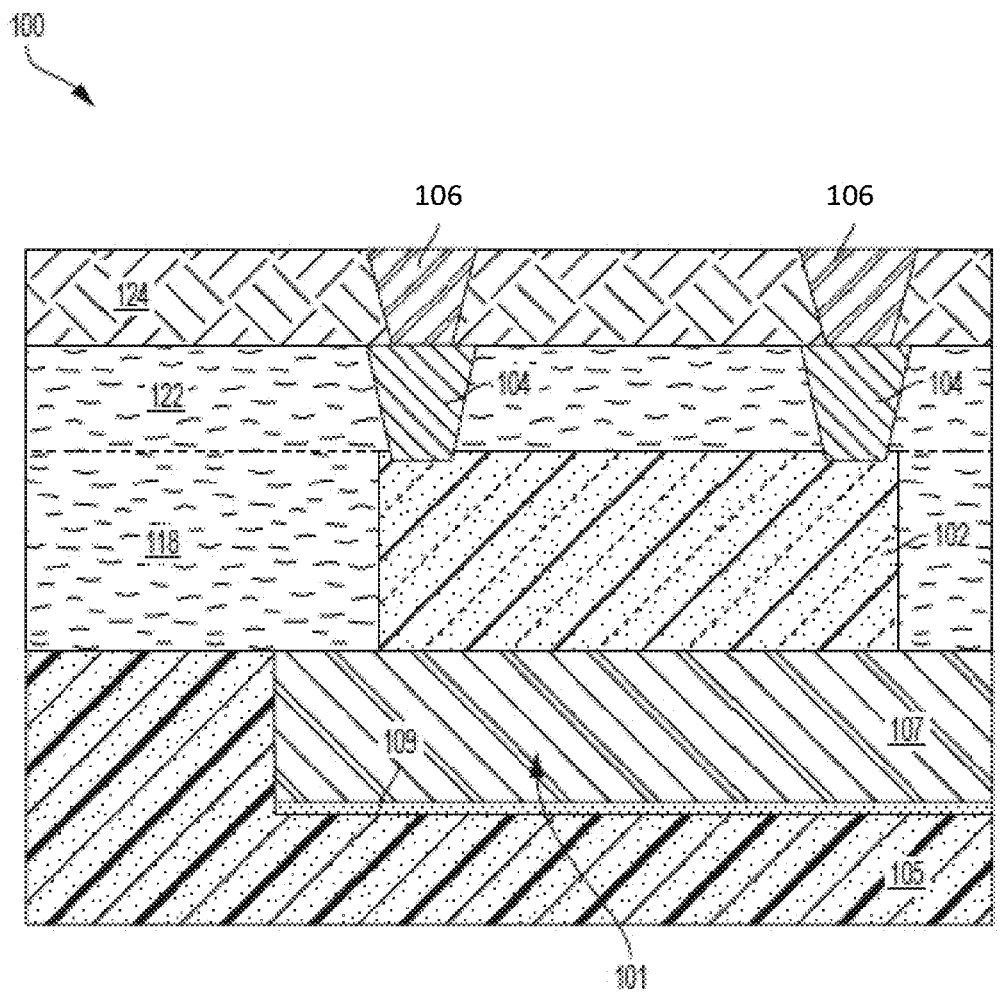
FIG. 3 illustrates a cross-sectional view of the semiconductor device of FIG. 1 cut along line B-B.

With reference now to FIG. 1, a semiconductor device 100 is shown from a top-down perspective. Specifically, the semiconductor device 100 includes a metal resistor (RM) 102, a contact bar (CA or CB) 104, a V0 contact via 106, and a metal interconnect 108. Specifically, FIG. 1 illustrates only a portion of the semiconductor device 100, as is shown in FIGS. 2-3, as FIG. 1 illustrates a dummy gate region 101 of the semiconductor device 100. The semiconductor device 100 can have any number of other features that are not shown in FIG. 1.

FIG. 2 is a cross-sectional view of the semiconductor device 100 cut along line A-A. FIG. 3 is a cross-sectional view of the semiconductor device 100 cut along line B-B. As shown in FIGS. 2-3, the semiconductor device 100 includes a substrate 105, an oxide layer 107, a liner 109, and any other layer desired. As shown, the semiconductor device 100 contains a dummy gate region 101 and a non-dummy gate region 103. The non-dummy gate region 103 contains an active gate stack 110. The active gate stack 110 can have a self-aligned cap 112, gate metal 113, a source/drain epitaxial growth layer 116, and any other layer desired for gate formation such as a low-k dielectric layer, high-k dielectric layer, liners such as SiN, and any other layer. The metal interconnect 108 shown in FIG. 1 is not shown in FIGS. 2-3.

In some aspects, the gates 110 can be formed over fins (not shown) patterned from a substrate. Epitaxial contacts 116 forming source and drain regions on opposing sides of the gates can be positioned over the fins. While any suitable method of forming gates 110 can be used, in some aspects, initially, fins (not shown) are patterned and etched into an underlying substrate 105 and separated by shallow trench isolation (STI) regions (such as layer 107). The fins may be formed from a substrate made of, for example, silicon, silicon germanium, or other suitable semiconductor material. A sacrificial insulator layer (not shown) can surround the fins. A STI etching and dielectric fill process can be performed to form the STI regions between sets of fins. The STI regions are isolation regions formed by etching trenches in the substrate and then filling the trenches with, for example, silicon oxide. Alternatively, the trenches may be lined with a silicon oxide liner formed by a thermal oxidation process and then filled with additional silicon oxide or another material.

Replacement gates 110 can then be formed over the fins. The replacement gates 110 are filled with a suitable replacement material, for example, amorphous silicon (polysilicon). An insulating hard mask layer for example, silicon nitride (SiN), SiOCN, or SiBCN is deposited on the replacement gate silicon to form a PC hard mask. The replacement gate 110 is then patterned and etched into the silicon and hard mask layer to form high aspect-ratio replacement gates over the substrate 105. An insulating liner material, for example, silicon nitride (SiN), SiOCN, or SiBCN, is deposited over the replacement gates 110, and then a reactive ion etch (RIE) process can be performed to form spacers surrounding the replacement gates 110.

In some aspects, n-type (or p-type) epitaxial contacts can be formed around the fins, by applying an organic patterning stack (not shown) over the p-type gate (or n-type gate) replacement gate 110 and patterned. A directional RIE process can be performed to remove the spacer material to expose the underlying fins. An epitaxial growth process over the fins can form the source and drain regions. Suitable materials for the epitaxial contacts depend on the type of MOSFET (n-type or p-type). Non-limiting examples of suitable materials include silicon or silicon-germanium containing p-type dopants (e.g., boron), n-type dopants (e.g., phosphorus), or any combination thereof. A low-k dielectric oxide forming the ILD layer 118 can then disposed over the epitaxial contacts 116. The ILD layer 118 may be formed from, for example, a low-k dielectric oxide, including but not limited to, spin-on-glass, a flowable oxide, a high density plasma oxide, or any combination thereof.

The dummy gate region 101, in some aspects, can be formed at the same time as the non-dummy gate region 103. As such, the dummy gate region 101 include an ILD oxide layer 118 and a liner 120 disposed above the oxide layer 107, and a dummy gate stack (not shown in FIGS. 1-3). As described herein, it is this dummy gate stack that can be replaced to form a metal resistor 102 that is integrated into the gate stack. As will be described in detail below, once the metal resistor 102 replaces the dummy gate stack, the contact (CA or CB) bar 104, V0 contact via 106, and metal interconnect 108 can be formed, along with other desired layers such as flowable oxide layer 122 and/or a dielectric layer 124. These and other features will be described in more detail below.

A variety of methods can be utilized to form the semiconductor device 100 having metal resistor 102 within a gate stack. Some of such methods are illustrated in FIGS. 4-12.

Figure 4:
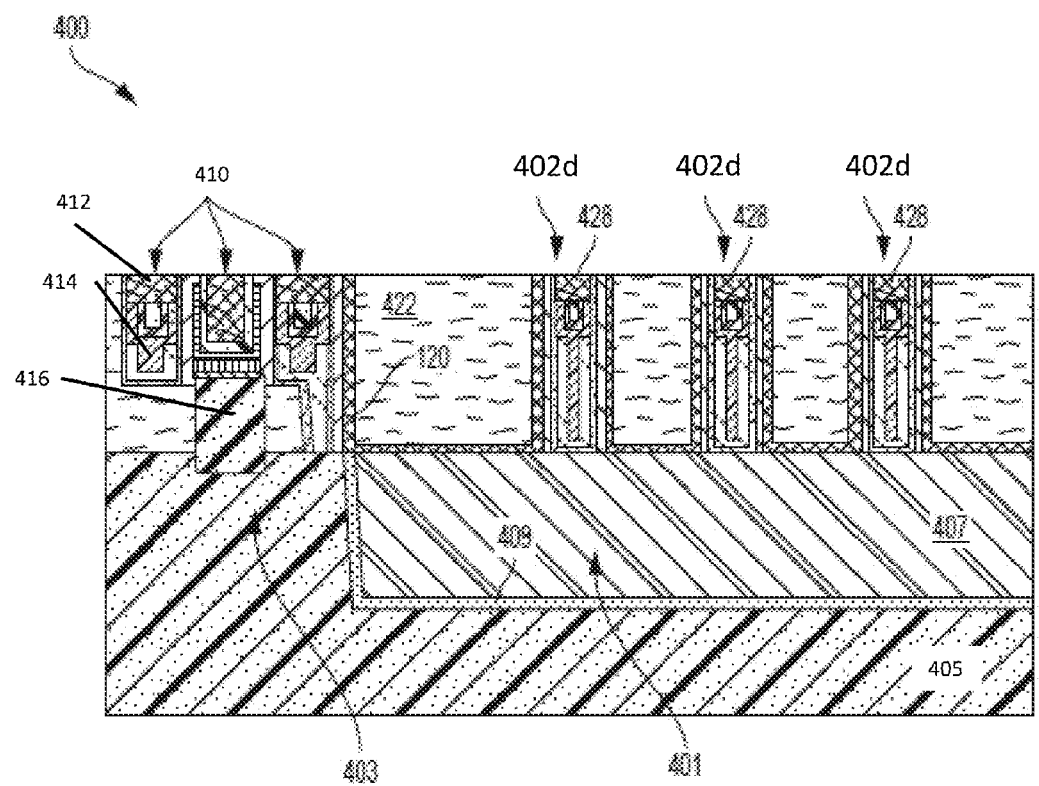
FIG. 4 illustrates an example starting point for forming a semiconductor device having metal resistor within a gate stack.

FIG. 4 illustrates an example starting point for forming a semiconductor device 400 having metal resistor within a gate stack. The semiconductor device 400 having an integrated metal resistor can be formed by first starting with a semiconductor device 400 having a dummy gate region 401 and a non-dummy gate region 403. As shown, the semiconductor device 400 includes a substrate 405, an oxide layer 407, a liner 409, and any other layer desired. The non-dummy gate region 403 contains an active gate stack 410. The gate stack 410 can have a silicon nitride (SiN) cap 412, gate metal 414, a source/drain epitaxial growth layer 416, and any other layer desired for gate formation such as a low-k dielectric layer, high-k dielectric layer, liners such as SiN, and any other layer. For example, as shown the semiconductor device 400 can optionally include a liner 409 formed above substrate 405. In some aspects, the liner 409 can be silicon nitride (SiN), however, any suitable liner material can be used. The semiconductor device 400 can also include an oxide layer 407. As shown, the oxide 407 can be beneath the dummy gates in the dummy gate region 401. In some aspects the oxide 407 can be a shallow-trench-isolation (STI) oxide. Above the oxide 407, the device 400 includes a dummy gate stack 402d.

As described above, the dummy gate stack 402d can include any desired gate materials and layers and can be formed using any known gate formation technique. For example, the dummy gate stack 402d can be formed simultaneously with gate stacks 402 and can be formed using either a gate-first or a gate-last technique. For example, a replacement metal gate (RMG) can be used. The gate stacks 402 and 402d, in some embodiments, include a high-k oxide, work function metal, and a gate metal. Non-limiting examples of suitable high-k oxides include hafnium dioxide, aluminum oxide, zirconium dioxide, hafnium silicate, zirconium silicate or any combination thereof. Non-limiting examples of suitable work function metals include aluminum, titanium, silver, copper, gold, or any combination thereof. Non-limiting examples of suitable gate metals include tungsten, tungsten titanium nitride, titanium, titanium nitride, tantalum, molybdenum, or any combination thereof. A self-aligned contact (SAC) cap 112, 428 can also be deposited which includes a hard mask material, for example, SiN. A CMP process can be performed over the SAC cap 112, 428 to planarize the structure.

Figure 5A:
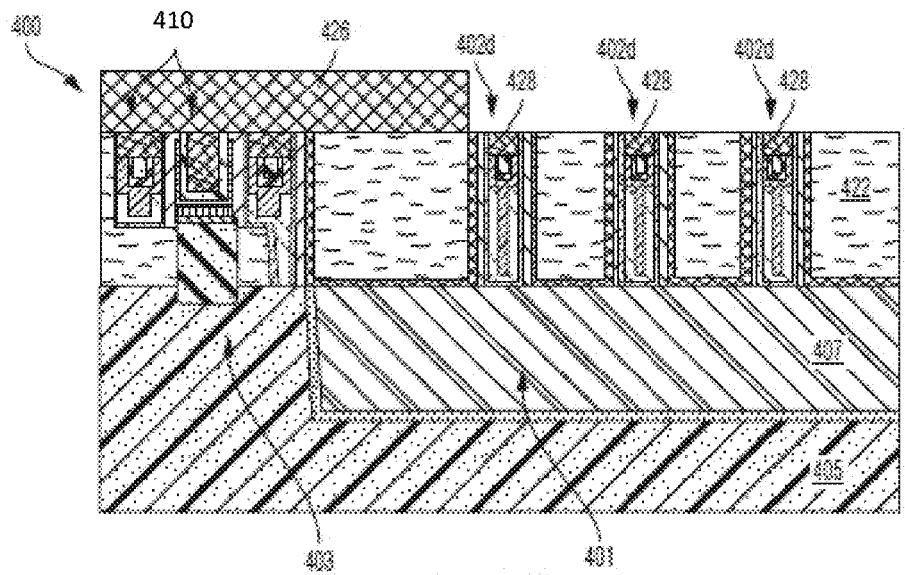
FIG. 5A illustrates the semiconductor device having a lithography resist mask disposed on the semiconductor device such that the dummy gate stack is exposed.
Figure 5B:
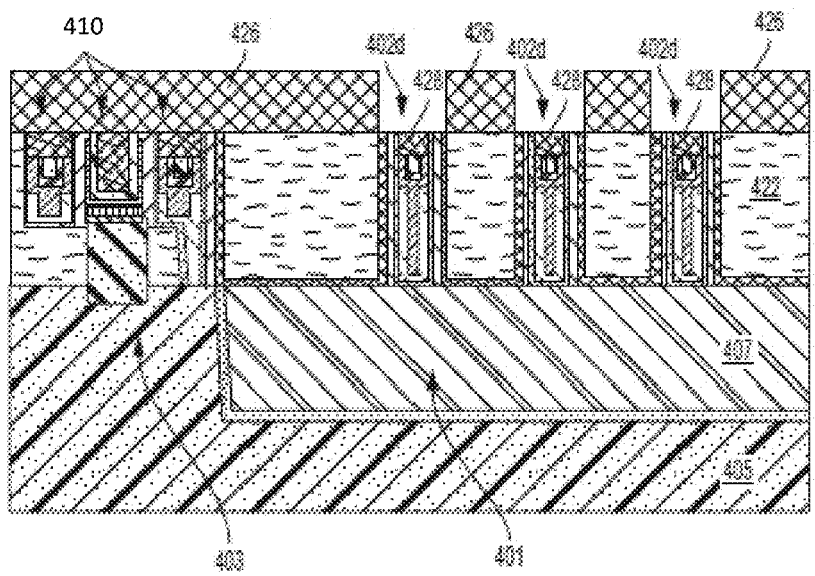
FIG. 5B illustrates the semiconductor device having a lithography resist mask disposed on the semiconductor device such that the dummy gate stack is exposed.

FIGS. 5A-5B illustrate the semiconductor device 400 having a lithography resist mask 426 disposed on the semiconductor device 400 such that the dummy gate stack 402d is exposed. In some aspects, the resist mask 426 can be deposited on the device 400 such that the resist covers the entire exposed surface of the device 400. Then, the resist mask 426 can be patterned as shown in FIGS. 5A-5B to expose the dummy gate stacks 402d. Any suitable resist mask can be used and any suitable method of depositing and patterning the resist mask 426 can be used. In some aspects, the resist mask 426 can also be referred to as a sacrificial patterning layer. The resist mask 426 can be deposited by any suitable method depending on the type of material and can be, for example, plasma-enhanced chemical vapor deposition (PECVD) or atomic layer deposition (ALD). For example, the resist mask 426 can be any lithographic materials including but not limited to photo resists, BARC/Resist bilayer, and/or organic planarization layer (OPL)/SiARC/Resist. In some non-limiting aspects, the resist mask 426 can be patterned using electron beam lithography.

Figure 6:
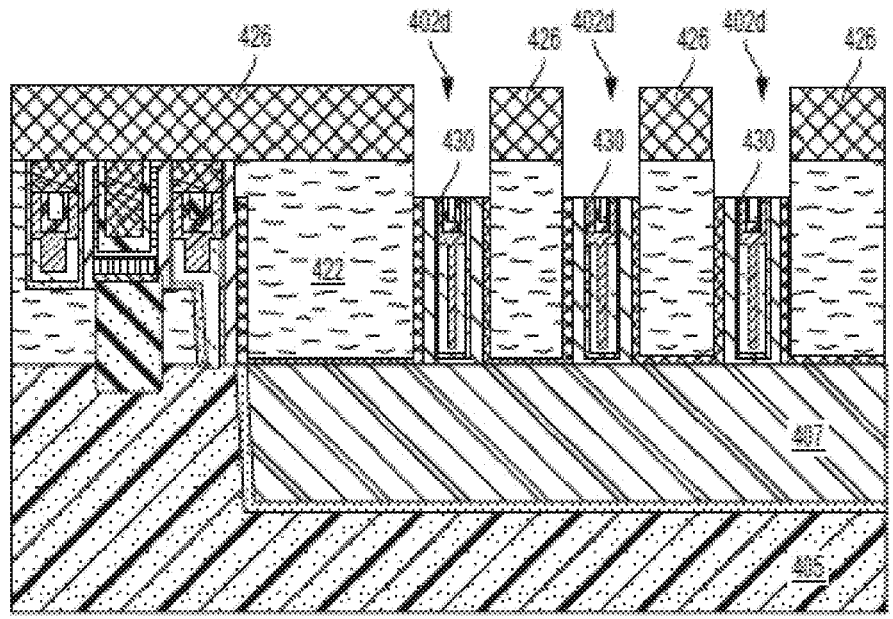
FIG. 6 illustrates the semiconductor device having the nitride cap removed.

Next, in some aspects, the dummy gate structure 402d can be removed systematically such that the gate structure 402d can be replaced with a metal resistor. FIG. 6 illustrates the semiconductor device 400 having the nitride cap 428 removed. As shown in FIG. 6, the gate structure 402d exposed by the patterned resist mask 426 can be etched to remove the nitride cap 428. The nitride cap 428, in some aspects and as described above, can be formed of silicon nitride (SiN). As such, a selective etching process that removes only SiN can be used. Any suitable etching process can be used though. By removing the nitride cap 428, the remaining gate metal 430 and other layers of the dummy gate stack 402d are exposed along with portion of the oxide layer 422 in the space vacated by the nitride cap 428, as shown in FIG. 6.

Figure 7:
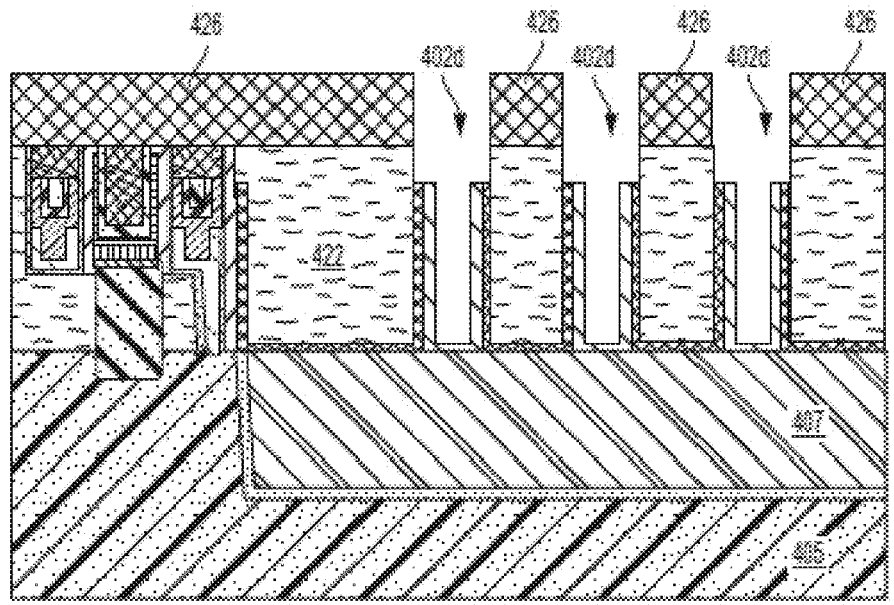
FIG. 7 illustrates the semiconductor device having the gate metal recessed.

Once exposed, the gate metal 430 can be recessed or removed. FIG. 7 illustrates the semiconductor device 400 having the gate metal 430 recessed. Any suitable gate metal can be used, such as for example, tungsten (W), titanium nitride (TiN), aluminum (Al) doped TiN, and/or tantalum nitride (TaN). The gate metal 430 can be removed or recessed using any known technique including but not limited to isotropic or anisotropic etching processes. In some aspects, etching can be performed with fluorinated gas plasmas, such as SF6, CF4, CBrF3 and/or CHF3.

Figure 8:
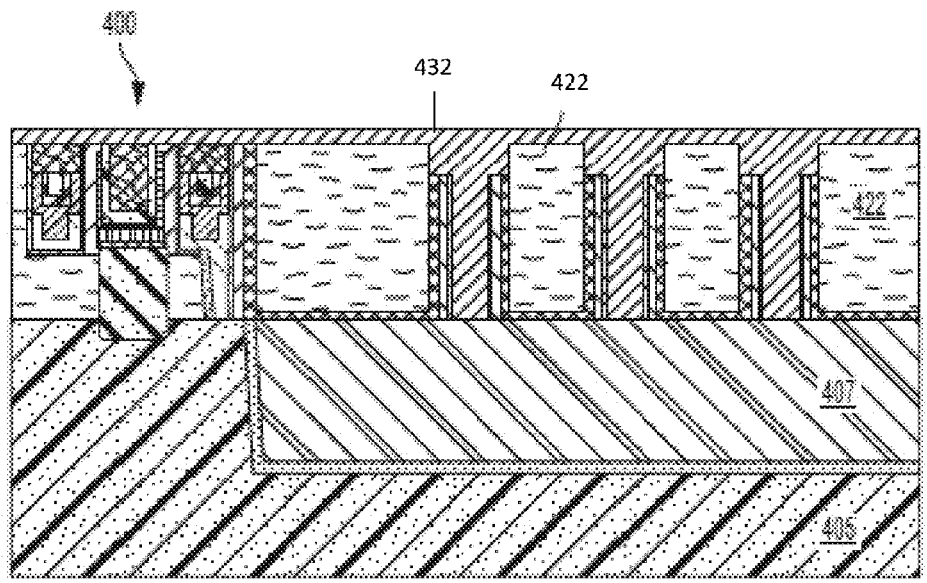
FIG. 8 illustrates the semiconductor device having an RM metal layer.

Once the gate metal 430 is recessed, the resist mask 426 can be removed from the semiconductor device 400. Any suitable process can be used to remove the resist mask 426 including but not limited to chemical-mechanical planarization (CMP) or an etching process. Moreover, once the resist mask 426 is removed, the exposed dummy gate stack 402d can be filled with a metal resistor (RM) metal layer. FIG. 8 illustrates the semiconductor device 400 having an RM metal layer 432. As shown, the RM metal layer 432 can be deposited across the entire surface of the semiconductor device 400 such that the dummy gate stack 402d is filled with the RM metal as well as the rest of the device 400 surface. The RM metal layer 432 can be any suitable resistor metal. For example, in some aspects the RM metal layer 432 is any of tungsten, tungsten carbide, or tungsten silicide (WSi). In some aspects, the RM metal layer 432 is tungsten carbide.

Figure 9:
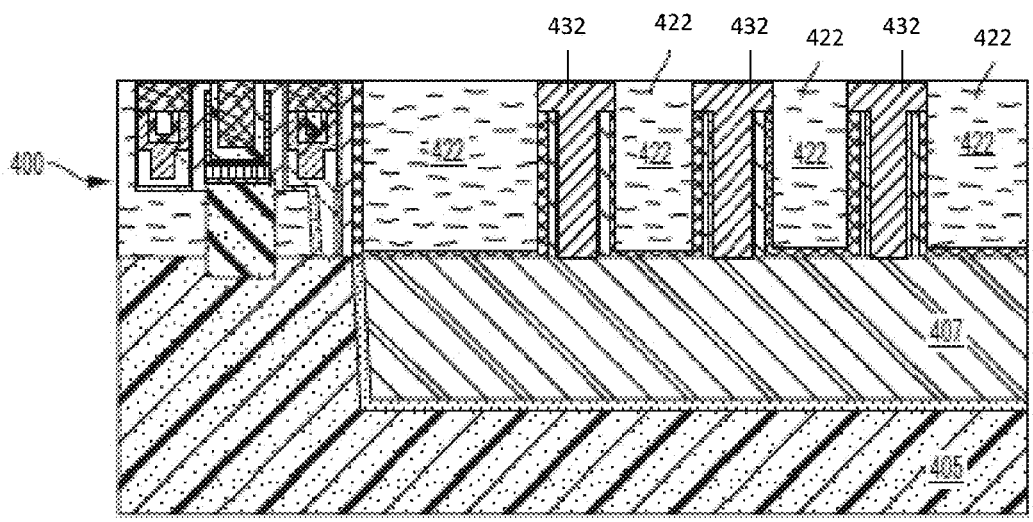
FIG. 9 illustrates the semiconductor device following a planarization process.

FIG. 9 illustrates the semiconductor device 400 following a planarization process. Once the RM metal layer 432 is deposited, the semiconductor device 400 can be planarized using any suitable planarization technique or other etching technique. For example, a CMP process can be used to planarize the device, stopping at the oxide layer 422. In some aspects, an etching process can be used that is selective to the oxide layer 422. As such, the RM metal layer 432 will remain in the dummy gate stack 402d and the surface of the device 400 will have a planar surface.

Figure 10:
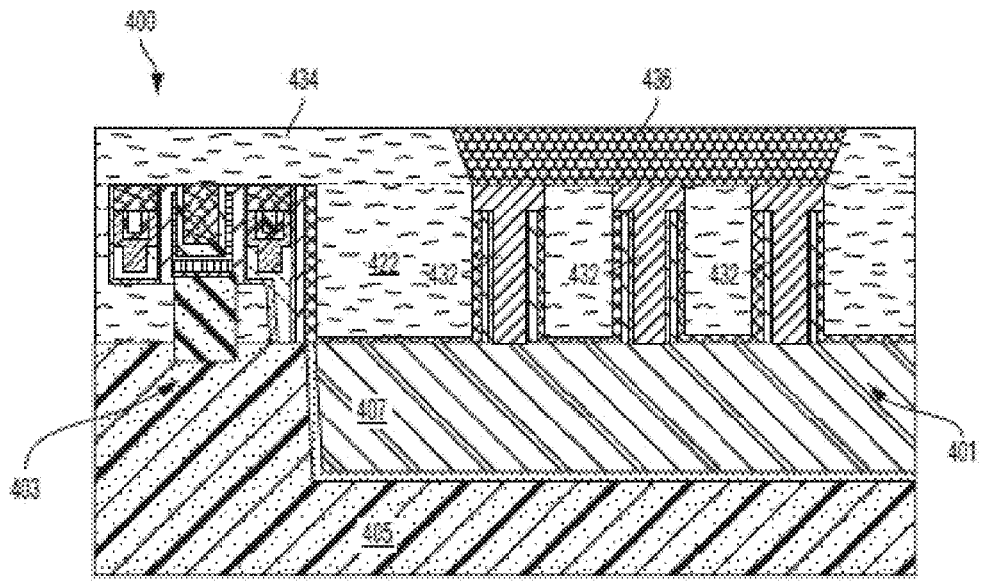
FIG. 10 illustrates the semiconductor device having a bar contact formed thereon.
Figure 11:
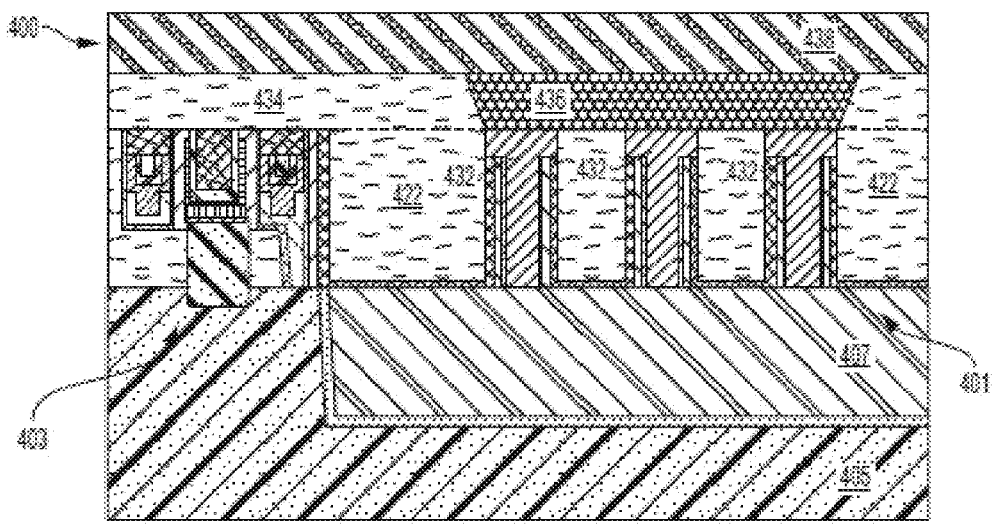
FIG. 11 illustrates the semiconductor device having a dielectric layer disposed thereon.
Figure 12:
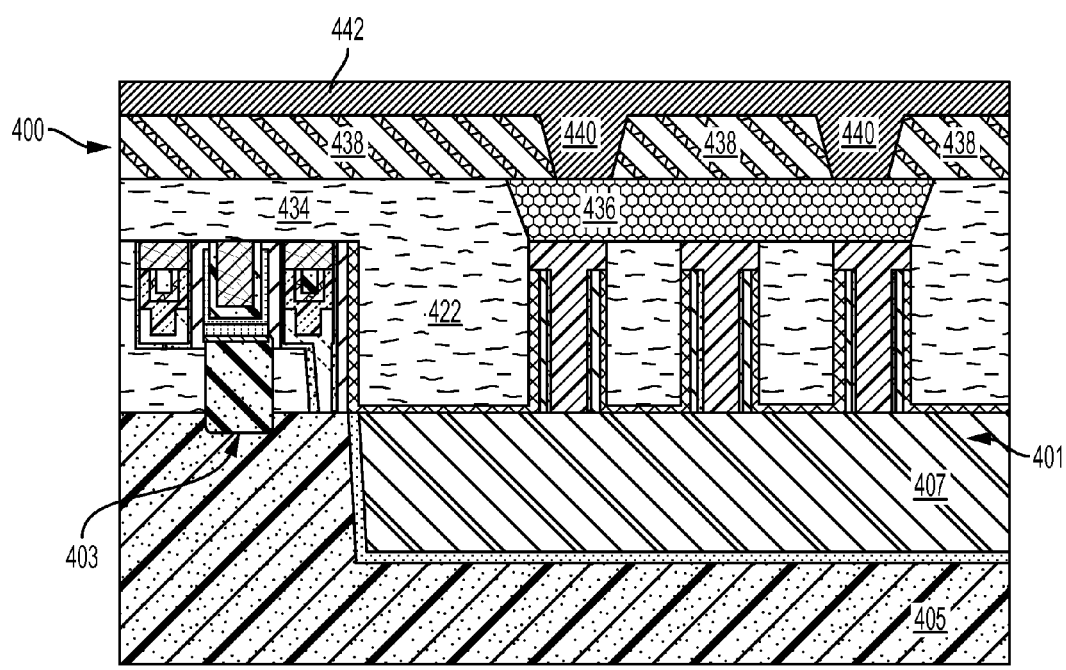
FIG. 12 illustrates the semiconductor device having a V0 contact via and a metal interconnect formed thereon.

Next, as illustrated in FIGS. 10-12, a CA or CB bar contact 436 and V0 contact via 440 can be formed on the semiconductor device 400. Any suitable technique, such as typical middle-of-line (MOL) processing, can be used to form the bar contact 436 and V0 contact 440. FIG. 10 illustrates the semiconductor device 400 having a bar contact 436 formed thereon. As shown, the bar contact 436 can be formed along with an additional oxide layer 434. The oxide layer 434 can be of the same material as oxide layer 422, or in some aspects, the oxide layer 434 can be a different oxide than that of layer 422. The bar contact 436 can be any suitable bar contact material. In some aspects, the bar contact 436 is formed of any of nickel, cobalt, iron, copper, gold, silver, ruthenium, palladium, platinum, iridium, and any mixtures or alloys thereof. Additionally, the bar contact 436 can have any suitable dimensions. For example, in some aspects the bar contact 436 can be between about 20 nanometers (nm) and 100 nanometers (nm) thick. The bar contact 436, as shown in FIGS. 10-12, can span the length of the dummy gate stacks 402d in dummy gate region 401 but any other suitable configuration can be used.

FIG. 11 illustrates the semiconductor device 400 having a dielectric layer 438 disposed thereon. Specifically, in some aspects, once the bar contact 436 is deposited on the device 400, a dielectric layer 438 can be deposited above the bar contact 436. Any suitable dielectric material can be used. For example, either a low-k dielectric material or a high-k dielectric material can be used. In some aspects, dielectric layer 438 is a low-k dielectric material.

FIG. 12 illustrates the semiconductor device 400 having a V0 contact via 440 and a metal interconnect 442 formed thereon. Once the dielectric layer 438 is deposited on the device 400, a V0 contact via 440 can be formed therein. Any suitable method of forming contact vias can be used. For example, the contact via 440 can be drilled or etched into the dielectric layer. Once the contact via 440 is formed, such as by drilling, a metal interconnect 442 can be formed on the surface of the device 400 such that the vias 440 are filled with the metal forming the metal interconnect 442. In some aspects, the metal interconnect 442 can be formed of any suitable metal interconnect material. In some aspects, the metal interconnect 442 can be formed of any of nickel, cobalt, iron, copper, gold, silver, ruthenium, palladium, platinum, iridium, and any mixtures or alloys thereof. For example, the metal interconnect 442 (and the V0 contact via 440) can be copper.

Thus, in use and in some non-limiting aspects, methods of forming a semiconductor device include forming a gate stack having a self-aligning cap and a gate metal on a substrate. In other aspects, for example, a method of forming a semiconductor device includes forming a gate stack in a dummy gate region of the semiconductor device, the gate stack having a self-aligning cap and a gate metal and being disposed above a shallow-trench-isolation oxide layer disposed on a substrate and forming a gate stack in a non-dummy gate region of the semiconductor device, the gate stack having a self-aligning cap and a gate metal and being disposed above the substrate. Methods can further include depositing a resist mask onto the semiconductor device and patterning the resist mask such that the gate stack is exposed (for example, the exposed gate stack can be a gate stack in the dummy gate region). Once the gate stack is exposed, in some aspects, methods include removing the self-aligning cap and the gate metal from the exposed gate stack and depositing a resistor metal on the semiconductor device such that a metal resistor is formed within the exposed gate stack. Once the resistor is formed, methods include forming a bar contact and contact via above the metal resistor.

As used herein, "deposition" means any suitable deposition process including but not limited to chemical vapor deposition (CVD), plasma vapor deposition (PVD), plasma enhanced CVD, atomic layer deposition (ALD), evaporation, chemical solution deposition, or like processes. As used herein, "etching" includes any suitable etching process including but not limited to wet etching processes using aqueous hydrofluoric acid (HF) and phosphoric acids, lithographic patterning and etching processes, reactive ion etching (RIE). As used herein, "patterning" means any suitable patterning process, including electron beam lithography.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device; comprising:
   forming an active gate stack and a dummy gate stack having a silicon nitride self-aligning cap and a gate metal on a substrate;
   depositing a resist mask onto the semiconductor device;
   patterning the resist mask such that the dummy gate stack is exposed;
   selectively removing the self-aligning cap from the exposed dummy gate stack such that the gate metal is exposed;
   removing the gate metal from the exposed dummy gate stack;
   after removing the gate metal from the exposed dummy gate stack, removing the resist mask;
   depositing a resistor metal on the semiconductor device such that a metal resistor is formed within the exposed dummy gate stack; and
   forming a bar contact and contact via above the metal resistor.

2. The method of claim 1, wherein the resistor metal is tungsten carbide.

3. The method of claim 1, wherein the contact via is formed of any of nickel, cobalt, iron, copper, gold, silver, ruthenium, palladium, platinum, iridium, and any mixtures or alloys thereof.

4. The method of claim 1, wherein the contact bar is formed of any of nickel, cobalt, iron, copper, gold, silver, ruthenium, palladium, platinum, iridium, and any mixtures or alloys thereof.

5. The method of claim 1, wherein the resist mask is polymethyl methacrylate.

6. The method of claim 1, wherein patterning the resist mask comprises using electron beam lithography.

7. The method of claim 1, further comprising depositing an oxide layer above the metal resistor.

8. The method of claim 1, wherein forming the dummy gate stack comprises forming a first gate stack on a shallow-trench-isolation oxide layer disposed above the substrate such that a dummy gate region is formed, and wherein forming the active gate stack comprises forming a second gate stack over a source/drain epitaxial contact such that a non-dummy gate region is formed.

9. The method of claim 8, wherein the metal resistor is formed in the dummy gate region.

10. The method of claim 1, wherein the dummy gate stack is formed simultaneously with the active gate stack.

11. The method of claim 1, wherein selectively removing the self-aligning cap from the exposed dummy gate stack comprises using an etching process that removes only silicon nitride.

12. The method of claim 1, further comprising, planarizing the semiconductor device after depositing the resistor metal on the semiconductor device.

13. A method of forming a semiconductor device, comprising:

forming a dummy gate stack in a dummy gate region of the semiconductor device, the dummy gate stack having a silicon nitride self-aligning cap and a gate metal and being disposed above a shallow-trench-isolation oxide layer disposed on a substrate;

forming an active gate stack in a non-dummy gate region of the semiconductor device, the active gate stack having a self-aligning cap and a gate metal and being disposed above the substrate;

depositing a resist mask onto the semiconductor device;

patterning the resist mask such that the dummy gate stack in the dummy gate region is exposed;

selectively removing the silicon nitride self-aligning cap from the exposed dummy gate stack such that the gate metal is exposed;

removing the gate metal from the exposed dummy gate stack;

after removing the gate metal from the exposed dummy gate stack, removing the resist mask;

depositing a resistor metal on the semiconductor device such that a metal resistor is formed within the exposed dummy gate stack; and forming a bar contact and contact via above the metal resistor.

14. The method of claim 13, wherein the resistor metal is tungsten carbide.

15. The method of claim 13, wherein the contact via is formed of any of nickel, cobalt, iron, copper, gold, silver, ruthenium, palladium, platinum, iridium, and any mixtures or alloys thereof.

16. The method of claim 13, wherein the contact bar is formed of any of nickel, cobalt, iron, copper, gold, silver, ruthenium, palladium, platinum, iridium, and any mixtures or alloys thereof.

17. The method of claim 13, wherein the resist mask is polymethyl methacrylate.

18. The method of claim 13, wherein patterning the resist mask comprises using electron beam lithography.

\* \* \* \* \*